(12) United States Patent
Sasaki et al.

(10) Patent No.: US 8,923,472 B2
(45) Date of Patent: Dec. 30, 2014

(54) FLIP FLOP, SHIFT REGISTER, DRIVER CIRCUIT, AND DISPLAY DEVICE

(75) Inventors: Yasushi Sasaki, Osaka (JP); Yuhichiroh Murakami, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 13/819,046

(22) PCT Filed: Aug. 31, 2011

(86) PCT No.: PCT/JP2011/069827
§ 371 (c)(1),
(2), (4) Date: Feb. 26, 2013

(87) PCT Pub. No.: WO2012/029876
PCT Pub. Date: Mar. 8, 2012

(65) Prior Publication Data
US 2013/0156148 A1    Jun. 20, 2013

(30) Foreign Application Priority Data

Sep. 2, 2010 (JP) ................. 2010-197203

(51) Int. Cl.
*G11C 19/00* (2006.01)
*H03K 3/02* (2006.01)
*G11C 19/18* (2006.01)
*G11C 19/28* (2006.01)
*G09G 3/36* (2006.01)

(52) U.S. Cl.
CPC ............... *H03K 3/02* (2013.01); *G11C 19/184* (2013.01); *G11C 19/28* (2013.01); *G09G 3/3677* (2013.01); *G09G 2310/0286* (2013.01)
USPC .................................. 377/64; 377/68; 377/79

(58) Field of Classification Search
None
See application file for complete search history.

(56) References Cited

U.S. PATENT DOCUMENTS 7,116,748 B2 * 10/2006 Nagao et al. ................. 377/79
8,223,112 B2 * 7/2012 Ohkawa et al. ............. 345/100
(Continued)

FOREIGN PATENT DOCUMENTS

WO    2009/034749 A1    3/2009

OTHER PUBLICATIONS

Official Communication issued in International Patent Application No. PCT/JP2011/069827, mailed on Oct. 11, 2011.

*Primary Examiner* — Tuan T Lam
(74) *Attorney, Agent, or Firm* — Keating & Bennett, LLP

(57) ABSTRACT

A flip-flop of the present invention includes: an input terminal; an output terminal; a first control signal terminal and a second control signal terminal; a first output section including a bootstrap capacitor, the first output section being connected to the first control signal terminal and the output terminal; a second output section connected to a first output section source and the output terminal; a first input section connected to the input terminal, the first input section charging the bootstrap capacitor; a discharge section discharging the bootstrap capacitor; a second input section connected to the input terminal, the second input section being also connected to the second output section; a reset section controlling the discharge section and the second output section, the reset section being connected to the second control signal terminal; a first initialization section controlling the first output section; a second initialization section controlling the first input section; and a third initialization section controlling the discharge section and the second output section. This makes it possible to realize a shift register capable of performing an all-ON operation regardless of clock signals.

20 Claims, 20 Drawing Sheets

(56) References Cited

U.S. PATENT DOCUMENTS

| | | | |
|---|---|---|---|
| 8,269,713 B2 * | 9/2012 | Furuta et al. | 345/100 |
| 8,269,714 B2 * | 9/2012 | Furuta et al. | 345/100 |
| 8,493,312 B2 * | 7/2013 | Furuta et al. | 345/100 |
| 2007/0018940 A1 * | 1/2007 | Park | 345/100 |
| 2010/0141641 A1 | 6/2010 | Furuta et al. | |
| 2010/0214206 A1 * | 8/2010 | Yokoyama et al. | 345/100 |
| 2013/0155044 A1 * | 6/2013 | Ohkawa et al. | 345/211 |

* cited by examiner

FLIP FLOP, SHIFT REGISTER, DRIVER CIRCUIT, AND DISPLAY DEVICE

TECHNICAL FIELD

The present invention relates to a flip-flop provided, for example, in a driver circuit of a display device.

BACKGROUND ART

Patent Literature 1 discloses a configuration (see FIG. 19) of a flip-flop provided in each stage of a shift register in a driver circuit, and a drive method (FIG. 20) of the flip-flop. As illustrated in FIG. 20, in this flip-flop, a first initialization signal (AON signal), a second initialization signal (AONB signal), and first and second clock signals CK1 and CK2 are set as follows. In a period to in which respective stages of the shift register are active (hereinafter, this is referred to as an all-ON operation, the AON signal is set High (active), the AONB signal is set Low (active) and CK1 and CK2 are set High. In a period tb after the completion of the all-ON operation, the AON signal is set Low (inactive), the AONB signal is set High (inactive) and CK1 and CK2 are set High. Further, in a period tc following the period tb, the AON signal is set Low (inactive), the AONB signal is set High (inactive) and CK1 and CK2 are set Low and an operation shifts to a regular operation.

CITATION LIST

Patent Literature

[Patent Literature 1]
International Publication No. WO2009/34749 (International Publication Date: Mar. 19, 2009)

SUMMARY OF INVENTION

Technical Problem

However, in the flip-flop, in the periods to (all-ON operation period) and tb (period immediately after the all-ON operation), it has been necessary to regulate the first and second clock signals CK1 and CK2 as illustrated in FIG. 20.

The present invention provides a flip-flop that realizes a shift register capable of performing the all-ON operation regardless of clock signals.

Solution to Problem

A flip-flop of the present invention includes: an input terminal; an output terminal; a first control signal terminal and a second control signal terminal; a first output section including a bootstrap capacitor, the first output section being connected to the first control signal terminal and the output terminal; a second output section connected to a first power source (power source corresponding to a potential at the time when the input terminal is inactive) and the output terminal; a first input section connected to the input terminal and a second power source (power source corresponding to a potential at the time when the input terminal is active), the first input section charging the bootstrap capacitor; a discharge section discharging the bootstrap capacitor; a second input section connected to the input terminal and the first power source, the second input section being also connected to the second output section; and a reset section controlling the discharge section and the second output section, the reset section being connected to the second control signal terminal. The flip-flop includes a first initialization section controlling the first output section; a second initialization section controlling the first input section; and a third initialization section controlling the discharge section and the second output section (This means that the first initialization section controls a potential of the output terminal).

In the flip-flop, during an all-ON operation, the first and second initialization sections cause the output terminal to become active. After the completion of the all-ON operation, the second and third initialization sections cause the output terminal to become inactive. Accordingly, in a shift register employing the flip-flop of the present invention, the all-ON operation can be performed regardless of signals (e.g., clock signals) that are inputted into the first and second control signal terminals.

The flip-flop of the present invention may be configured such that: the first initialization section electrically connects or disconnects the first output section and the second power source; the second initialization section electrically connects or disconnects the first input section and the second power source; and the third initialization section electrically connects or disconnects the discharge section and the second power source and also electrically connects or disconnects the second output section and the second power source.

The flip-flop of the present invention may be configured such that: the second initialization section further connects or disconnects the second output section and each of the third initialization section, the reset section and the discharge section.

The flip-flop of the present invention may be configured such that: the first initialization section further controls the second output section.

The flip-flop of the present invention may be configured to further include: a feedback section controlling the second output section, the feedback section being connected to the output terminal.

The flip-flop of the present invention may be configured such that: the first input section and the first output section are connected via a relay section.

The flip-flop of the present invention may be configured such that: the first output section is provided with a first transistor; the second output section is provided with a second transistor; the first input section is provided with a third transistor; the discharge section is provided with a fourth transistor; the second input section is provided with a fifth transistor; the reset section is provided with a sixth transistor; the first initialization section is provided with a seventh transistor; the second initialization section is provide with a eighth transistor; and the third initialization section is provided with a ninth transistor, the first to ninth transistors all being of an identical conductivity-type.

The flip-flop of the present invention may be configured to further include: first to third initialization terminals; and first to third nodes, wherein: the first transistor has conductive electrodes one of which is connected to the first control signal terminal and the other one of which is connected to a control terminal of the first transistor via the bootstrap capacitor, which other conductive electrode is connected to the output terminal and also connected to the first power source via the second transistor; respective control terminals of the third and fifth transistors are connected to the input terminal; a control terminal of the sixth transistor is connected to the second control signal terminal; a control terminal of the seventh transistor is connected to the first initialization terminal; a control terminal of the eighth transistor is connected to the second initialization terminal; a control terminal of the ninth transistor is connected to the third initialization terminal; the first node is connected to one of conductive electrodes of the third transistor directly or via a resistor, and also connected to the first power source via the fourth transistor; the other one of the conductive electrodes of the third transistor is connected to the second power source via the eighth transistor; the second node is connected to a control terminal of the second transistor and also connected to the first power source via the fifth transistor; and the third node is connected to a control terminal of the fourth transistor, also connected to the second power source via the ninth transistor, and further connected to the second power source via the sixth transistor and another resistor that is different from the resistor via or without which the first node is connected to the one conductive electrode of the third transistor.

The flip-flop of the present invention may be configured to further include: a tenth transistor in the second initialization section, the tenth transistor having a control terminal connected to the second initialization terminal, wherein: the second node is connected to the third node via the tenth transistor.

The flip-flop of the present invention may be configured such that: the first initialization section is further provided with an eleventh transistor whose control terminal is connected to the first initialization terminal; and the second node is connected to the first power source via the eleventh transistor.

The flip-flop of the present invention may be configured to further include: a twelfth transistor whose control terminal is connected to the output terminal, wherein: the second node is connected to the first power source via the twelfth transistor.

The flip-flop of the present invention may be configured to further include: a thirteenth transistor whose control terminal is connected to the second power source, wherein: the first node is connected to the control terminal of the first transistor via the thirteenth transistor.

The flip-flop of the present invention may be configured such that: respective constituent materials of the resistor and the another resistor are identical to a constituent material of a channel of each of the first to ninth transistors.

The flip-flop of the present invention may be configured such that: the first output section is provided with a first transistor; and the bootstrap capacitor is a parasitic capacitor of the first transistor.

A shift register of the present invention includes the flip-flop in each stage.

The shift register of the present invention may be configured such that: a second control signal terminal of a flip-flop in one stage is connected to an output terminal of a flip-flop in a subsequent stage.

A driver circuit of the present invention includes: a shift register including the flip-flop in each stage, wherein: the first and second control signal terminals of the flip-flop in each stage of the shift register are supplied with respective clock signals whose active periods do not overlap.

A driver circuit of the present invention includes: a shift register including the flip-flop in each stage, wherein: in the flip-flop in each stage of the shift register, (i) the first initialization terminal is supplied with a first initialization signal, (ii) the second initialization terminal is supplied with a second initialization signal, and (iii) the third initialization terminal is supplied with a third initialization signal.

The driver circuit of the present invention may be configured such that: the second initialization signal is an inversion signal of the first initialization signal; and the third initialization signal becomes active at a timing when the first initialization signal shifts from active to inactive, and then the third initialization signal becomes inactive after the timing.

The driver circuit of the present invention may be configured such that: the third initialization signal becomes inactive in synchronization with a timing when a start pulse becomes active which start pulse regulates a shift start timing.

The display device of the present invention includes the flip-flop.

Advantageous Effects of Invention

As described above, the present invention makes it possible to realize a shift register capable of performing an all-ON operation regardless of clock signals.

DESCRIPTION OF EMBODIMENTS

The following discusses an embodiment of the present invention, with reference to FIGS. 1 through 18.

Figure 2:
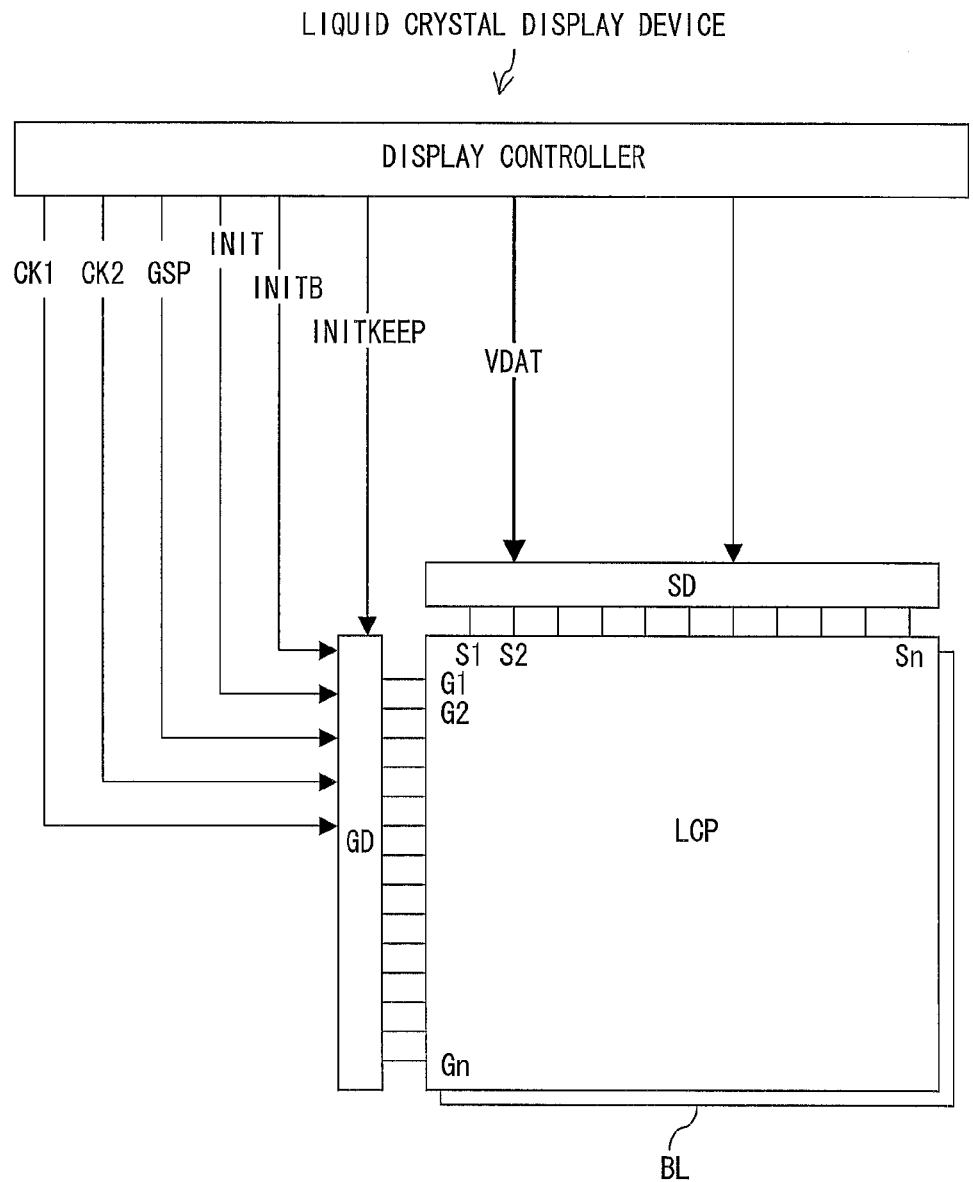
FIG. 2 is a block diagram illustrating a configuration of a liquid crystal display device of the present invention.

FIG. 2 illustrates one example configuration of a liquid crystal display device including a flip-flop of the present invention. The liquid crystal display device illustrated in FIG. 2 includes a display controller, a gate driver GD, a source driver SD, a liquid crystal panel LCP, and a backlight BL (which is used in a case where the liquid crystal display device is of a light transmissive type). The display controller controls the gate driver GD and the source driver SD. For example, the display controller supplies, to the gate driver GD, first and second clock signals (CK1 signal and CK2 signal, respectively), a gate start pulse signal (GSP signal), a first initialization signal (INIT signal), a second initialization signal (INITB signal), and a third initialization signal (INIT-KEEP signal). The gate driver GD drives scanning signal lines G1 to Gn of the liquid crystal panel LCP, while the source driver SD drives data signal lines S1 to Sn of the liquid crystal panel LCP. The gate driver GD and the source driver SD may be monolithically formed with the liquid crystal panel LCP.

Figure 3:
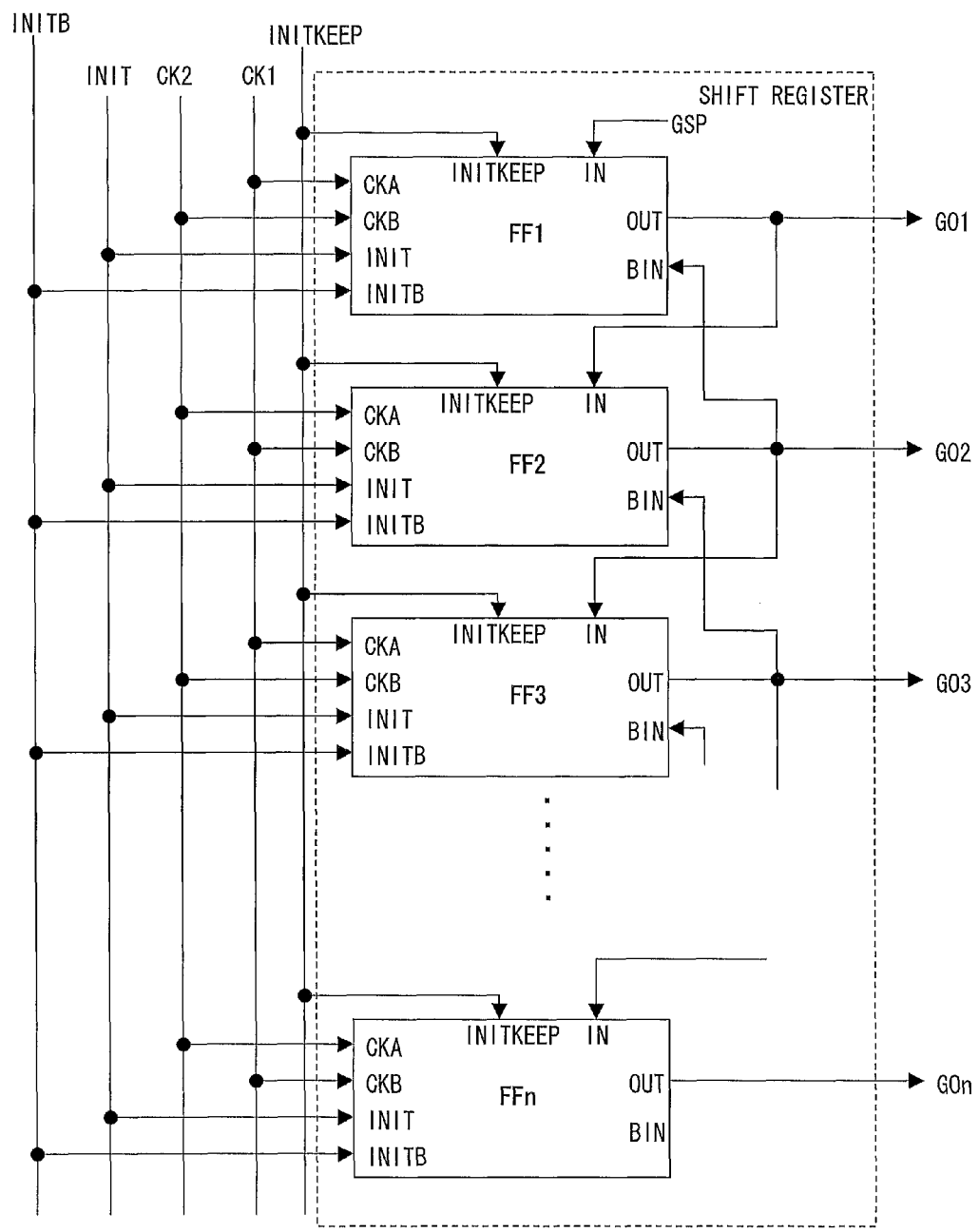
FIG. 3 is a circuit diagram illustrating an example configuration of a shift register of the present invention.

The gate driver GD includes a shift register as illustrated in FIG. 3. The shift register illustrated in FIG. 3 includes a plurality of flip-flops that are cascaded with each other. Each of the flip-flops includes an input terminal (IN terminal), an output terminal (OUT terminal), first and second clock signal terminals (first and second control signal terminals) CKA and CKB, a first initialization terminal (INIT terminal), a second initialization terminal (INITB terminal), a third initialization terminal (INITKEEP terminal), and a back-in terminal (BIN terminal).

Here, in flip-flops in odd-numbered stages (FF1, FF3, etc.), the CK1 signal is supplied to the CKA terminal, and the CK2 signal is supplied to the CKB terminal. In flip-flops in even-numbered stages (FF2, FFn, etc.), the CK2 signal is supplied to the CKA terminal, and the CK1 signal is supplied to the CKB terminal. Further, the INIT signal, the INITB signal, and the INITKEEP signal are supplied to each of the flip-flops (FF1 to FFn). Still further, an IN terminal of one flip-flop stage is connected to an OUT terminal of a preceding flip-flop stage, and a BIN terminal of the one flip-flop stage is connected to an OUT terminal of a subsequent flip-flop stage. Note that the CK1 and CK2 signals are two clock signals arranged such that their active periods (High periods) do not overlap each other.

Figure 1:
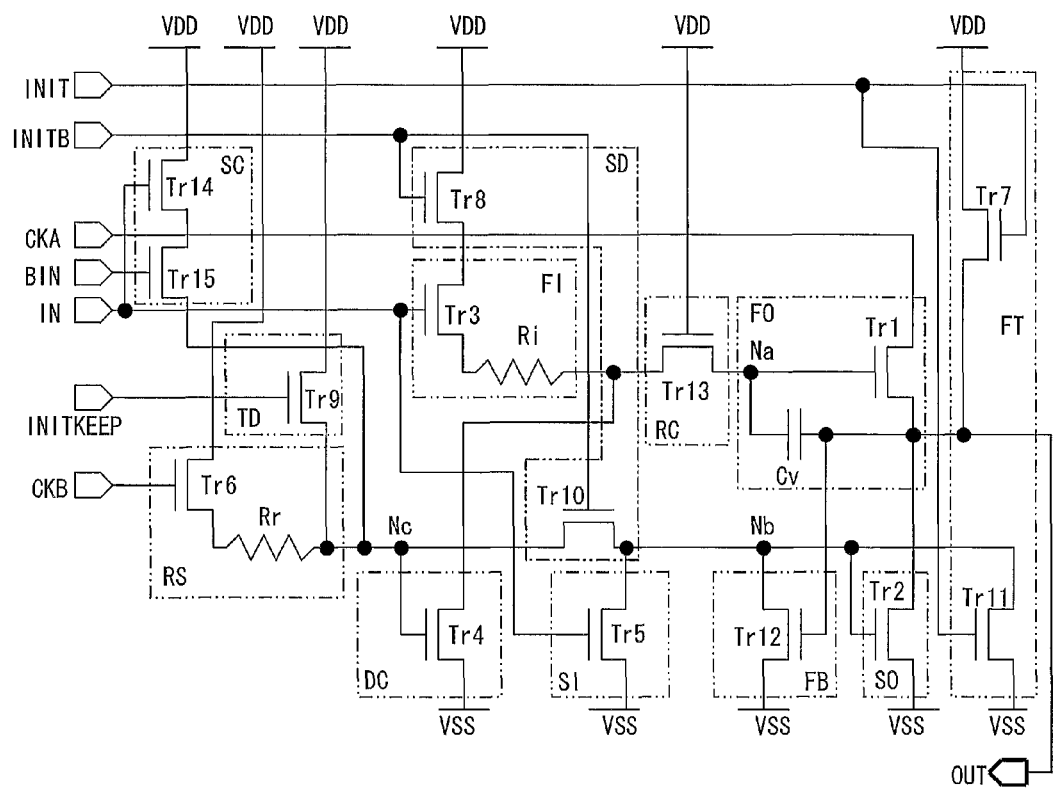
FIG. 1 is a circuit diagram illustrating a configuration of a flip-flop.

As each stage of the shift register illustrated in FIG. 3, the flip-flop according to the present invention is used. FIG. 1 illustrates an example configuration of the flip-flop according to the present invention. The flip-flop illustrated in FIG. 1 includes an IN terminal, an OUT terminal, CKA and CKB terminals, and a bootstrap capacitor Cv. This flip-flop illustrated in FIG. 1 is provided with: a first output section FO that is connected to the CKA terminal and the OUT terminal; a second output section SO which is connected to a first power source VSS (low-level power source) and the OUT terminal; a first input section FI which is connected to the IN terminal and a second power source VDD (high-level power source) and charges the bootstrap capacitor Cv; a discharge section DC that discharges the bootstrap capacitor Cv; a second input section SI that is connected to the IN terminal and the first power source VSS and is connected to the second output section; a reset section RS that is connected to the CKB terminal and controls the discharge section DC and the second output section SO; a first initialization section FT that controls the first output section FO; a second initialization section SD that controls the first input section FI; a third initialization section TD that controls the discharge section DC and the second output section SO; a feedback section FB that is connected to the OUT terminal and controls the second output section SO; a relay section RC that relays the first input section FI and the first output section FO; and a malfunction preventing section SC that prevents one flip-flop stage and other flip-flop stage(s) from becoming active at the same time during a regular operation.

More specifically, the flip-flop according to the present invention is configured such that: the first output section FO includes a transistor Tr1 (first transistor) and the bootstrap capacitor Cv; the second output section SO includes a second transistor Tr2 (second transistor); the first input section FI includes a transistor Tr3 (third transistor) and a resistor Ri; the discharge section DC includes a transistor Tr4 (fourth transistor); the second input section SI includes a transistor Tr5 (fifth transistor); the reset section RS includes a transistor Tr6 (sixth transistor) and a resistor Rr; the first initialization section FT includes a transistor Tr7 (seventh transistor) and a transistor Tr11 (eleventh transistor); the second initialization section includes a transistor Tr8 (eighth transistor) and a transistor Tr10 (tenth transistor); the third initialization section includes a transistor Tr9 (ninth transistor); the feedback section FB includes a transistor Tr12 (twelfth transistor); the relay section RC includes a transistor Tr13 (thirteenth transistor); and the malfunction preventing section SC includes transistors Tr14 and Tr15. Note that the transistors Tr1 through Tr15 all are of the same conductivity-type (n-channel type).

Further, the transistor Tr1 is arranged such that: a drain electrode of the transistor Tr1 is connected to the CKA terminal; a gate electrode and a source electrode of the transistor Tr1 are connected to each other via the bootstrap capacitor Cv; and the source electrode is connected to the OUT terminal and also connected to the first power source VSS via the transistor Tr2.

In addition, gate terminals of the respective transistors Tr3, Tr5, and Tr14 are connected to the IN terminal; a gate terminal of the transistor Tr6 is connected to the CKB terminal; gate terminals of the respective transistors Tr7 and Tr11 are connected to the INIT terminal; gate terminals of the respective transistors Tr8 and Tr10 are connected to the INITB terminal; a gate terminal of the transistor Tr9 is connected to the INITKEEP terminal; a gate terminal of the transistor Tr13 is connected to the second power source VDD; and a gate terminal of the transistor Tr15 is connected to the BIN terminal.

Further, a first node Na connected to the gate terminal of the transistor Tr1 is connected to one end of the resistor Ri via the transistor Tr13 and is connected to the first power source VSS via the transistor Tr4. The other end of the resistor Ri is connected to the second power source VDD via the transistors Tr3 and Tr8 (Note that the transistor Tr3 is located on the side of the resistor Ri, while the transistor Tr8 is located on the side of the second power source VDD.).

Still further, a second node Nb connected to a gate terminal of the transistor Tr2 is connected to the first power source VSS via the transistor Tr5, is connected to the first power source VSS via the transistor Tr11, and is connected to the first power source VSS via the transistor Tr12. In addition, a third node Nc connected to a gate terminal of the transistor Tr4 is connected to the second power source VDD via the transistor Tr9 and is connected to the second power source VDD via the resistor Rr and the transistor Tr6 (Note that the resistor Rr is located on the side of the third node Nc, while the transistor Tr6 is located on the side of the second power source VDD.). The second node Nb and the third node Nc are connected to each other via the transistor Tr10. Moreover, the third node Nc is connected to the second power source VDD via the transistors Tr15 and Tr14 (Note that the transistor Tr15 is located on the side of the third node Nc, while the transistor Tr14 is located on the side of the second power source VDD.).

Figure 4:
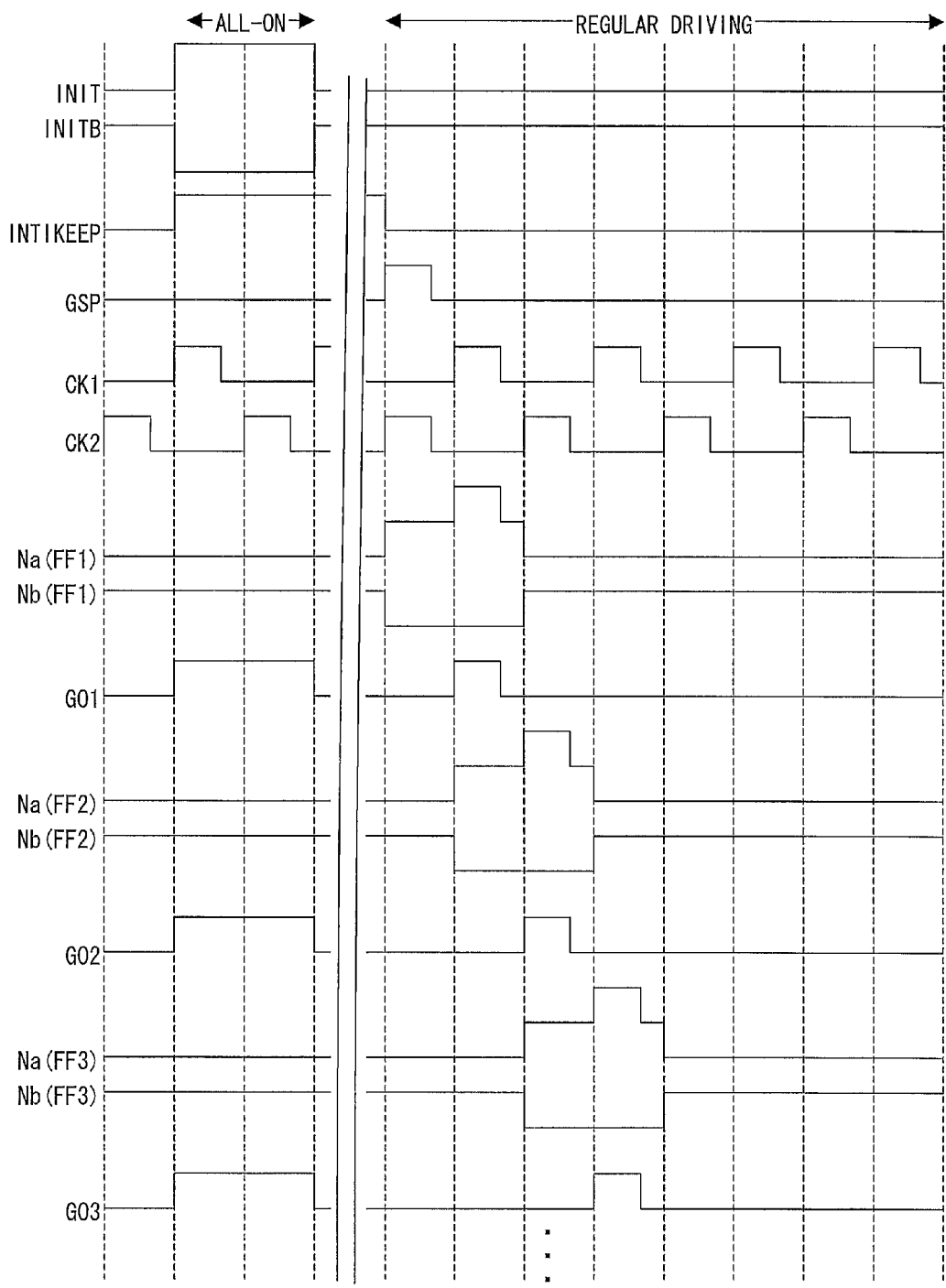
FIG. 4 is a timing chart illustrating an operation of the shift register illustrated in FIG. 3.

The operation of the shift register according to the present invention is illustrated in FIG. 4. During an all-ON period, the INIT signal is active (High), the INITB signal is active (Low), and the INITKEEP signal is active (High). The bootstrap capacitor Cv is thus discharged by the discharge section DC (since the transistors Tr9 and Tr4 are switched ON, while the transistor Tr1 is switched OFF.). This causes the first output section FO to become inactive and also causes the second output section SO to become inactive (since the transistor Tr11 is switched ON, while the transistor Tr2 is switched OFF.). Thus, the source electrode of the transistor Tr1 in the first output section FO is connected to the second power source VDD by the first initialization section FT, so that a VDD potential (High) is reliably outputted to the OUT terminal regardless of the CK1 and CK2 signals. In the present configuration, since the second node is at the VSS potential and the third node is at the VDD potential, during the all-ON period, the transistor Tr10 is switched OFF by the INITB signal so that both the second node and the third node are interrupted. On the other hand, until the GSP signal becomes active after the completion of the all-ON period, the INIT signal is inactive (Low) and the INITB signal is inactive (High), the INITKEEP signal is active (High), and the transistor Tr10 is switched ON. Consequently, the second output section SO becomes active (the transistor Tr2 is switched ON.). Accordingly, a VSS potential (Low) is reliably outputted to the OUT terminal regardless of the CK1 and CK2 signals.

The operation during a regular driving is as follows. During the regular driving, the INIT signal is inactive (Low), the INITB signal is inactive (High), and the INITKEEP signal is inactive (Low). Note that the INITKEEP signal becomes inactive (Low) in synchronization with the activation of the GSP signal (the transistors Tr8 and Tr10 are switched ON, while the transistors Tr7 and Tr9 are switched OFF.).

For example, in the flip-flop FF1 at the first stage (see FIG. 3), when the IN terminal becomes active (the GSP signal becomes active), the bootstrap capacitor Cv is charged so that a potential of the first node Na is pre-charged to about a level obtained by the VDD potential—Vth (Vth represents a threshold voltage of a transistor). At this time, since the CK2 signal is High (the CKB terminal is active), the transistor Tr5 and the transistor Tr6 are both switched ON, and the second node Nb becomes a VSS potential. This is because driving performance of the transistor Tr6 becomes higher than that of the transistor Tr5 due to a current limit of the resistor Rr. The VSS potential of the second node Nb is maintained even when the GSP signal becomes inactive (since the transistors Tr2, Tr12, and Tr4 stay OFF).

Here, when the CK1 signal rises, a potential of the first node Na is pumped up to a level equal to or greater than the VDD potential due to a bootstrap effect. This causes the CK1 signal (High) to be outputted from the OUT terminal (GO1), without suffering from a potential drop (so-called threshold drop). When the OUT terminal becomes High, the transistor Tr12 of the feedback section FB is switched ON, and the second node Nb reliably becomes the VSS potential. Note that when the CK1 signal falls, the bootstrap effect wears off, and the potential of the first node Na therefore returns to the level obtained by the VDD potential—Vth. Subsequently, when the CK2 signal rises, the transistor Tr4 of the discharge section DC is switched ON. This causes the bootstrap capacitor Cv to be discharged and causes the transistor Tr2 to be switched ON. Consequently, the VSS (Low) is outputted from the OUT terminal (GO1). This completes a reset (self-reset) of the flip-flop FF1.

Further, in the configuration illustrated in FIG. 1, the malfunction preventing section SC is provided. Therefore, in a case where outputs of the preceding flip-flop stage (flip-flop stage previous to the one flip-flop stage) and the subsequent flip-flop stage (flip-flop stage subsequent to the one flip-flop stage) become active during the regular operation, the transistors Tr14 and Tr15 are both switched ON, and the transistor Tr2 is switched ON, so that the OUT terminal can be forcibly set to the VSS potential (Low). Still further, in the configuration illustrated in FIG. 1, the relay circuit RC (Tr13) is provided. Therefore, when the potential of the first node Na is set to a level equal to or higher than a given level due to the bootstrap effect, the transistor Tr13 is switched OFF. This makes it possible to protect the transistor Tr4 of the discharge section DC from a high voltage.

Figure 5:
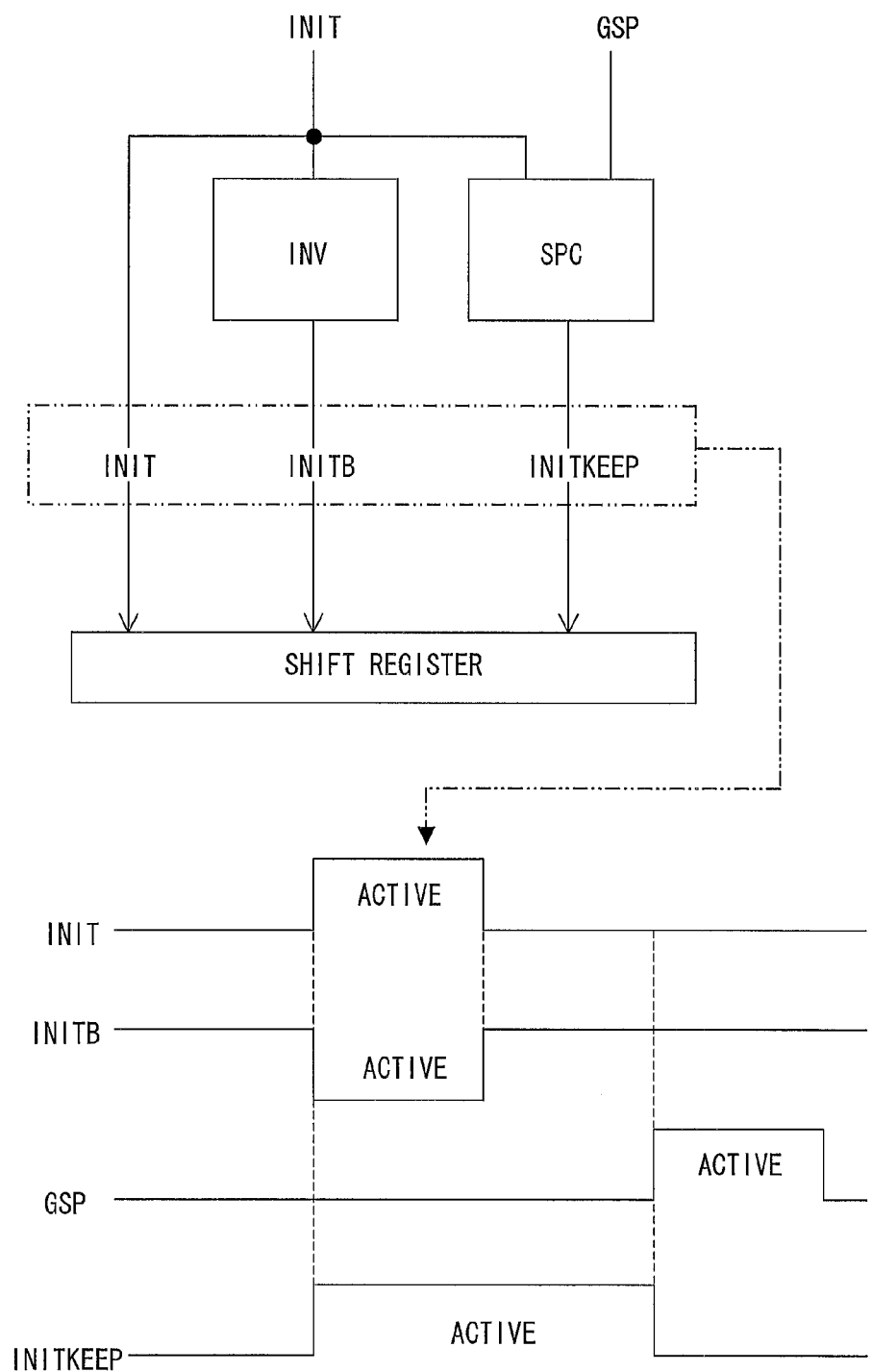
FIG. 5 is an explanatory diagram of first to third initialization signals.

The INITB signal and the INITKEEP signal, which are inversion signals of the INIT signal, are generated from the INIT signal. That is, as illustrated in FIG. 5, an inverter circuit INV outputs the INTB signal from the INIT signal, and a signal processing circuit SPC generates the INITKEEP signal by using the INIT signal. Here, the INITB signal is an inversion signal of the INIT signal, and the INITKEEP signal becomes active (High) at a timing of transition of the INIT signal from active (High) to inactive (Low). After such a timing, the INITKEEP signal becomes inactive (Low) (for example, in synchronization with the activation of the GSP signal as illustrated in FIG. 6).

Figure 6:
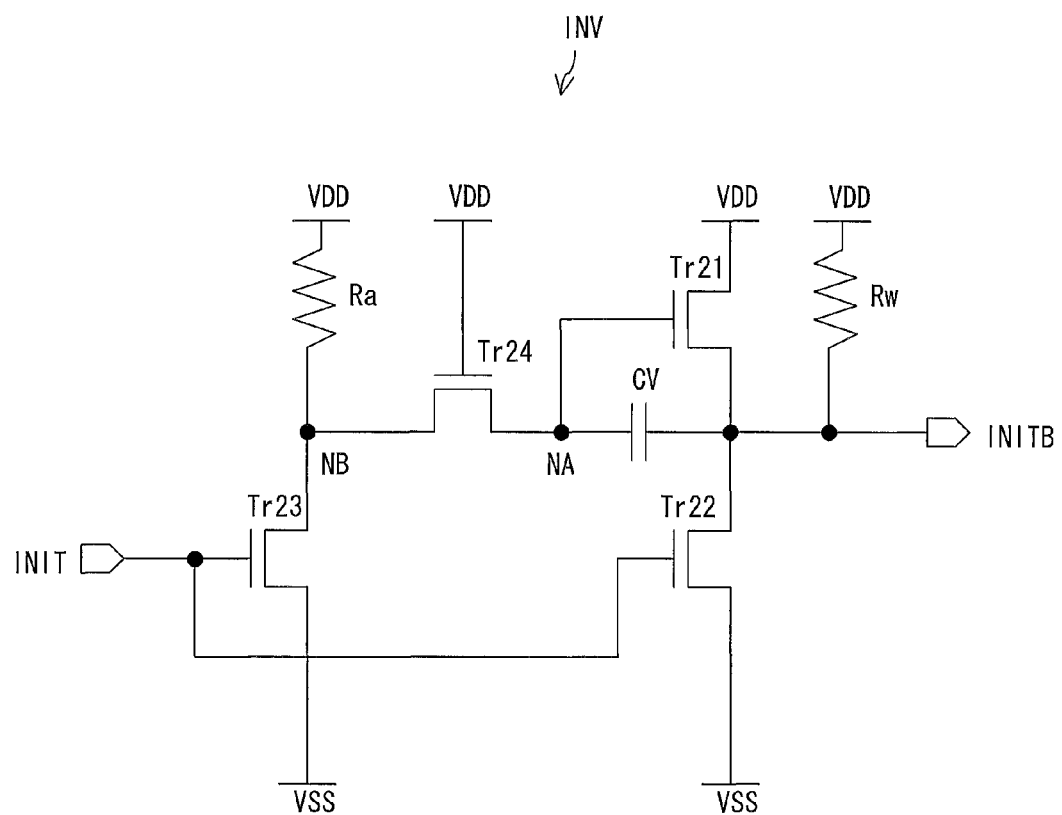
FIG. 6 is a circuit diagram of an inverter circuit employed in a driver of the liquid crystal display device of the present invention.

FIG. 6 is a circuit diagram illustrating a configuration of the inverter circuit INV. As illustrated in FIG. 6, the inverter circuit INV includes n-channel transistors Tr21 to Tr24, resistors Ra and Rw, a bootstrap capacitor CV, an IN terminal, and an OUT terminal.

The transistor Tr21 is arranged such that: a gate electrode and a source electrode of the transistor Tr21 are connected to each other via the bootstrap capacitor CV; a drain electrode of the transistor Tr21 is connected to the second power source VDD; and a source electrode of the transistor Tr21 is connected to the OUT terminal. Gate electrodes of the respective transistors Tr22 and Tr23 are connected to the IN terminal. A gate electrode of the transistor Tr24 is connected to the second power source VDD. The gate electrode of the transistor Tr21 is connected to a node NA. This node NA is connected to a node NB via the transistor Tr24. The node NB is connected to the second power source VDD via the resistor Ra and is also connected to the first power source VSS via the transistor Tr23. In addition, the OUT terminal is connected to the second power source VDD via the resistor Rw and is also connected to the first power source VSS.

In the inverter circuit INV illustrated in FIG. 6, when the IN terminal becomes active (High), the nodes NA and NB become the VSS potential (Low). Then, the transistor Tr21 is switched OFF while the transistor Tr22 is switched ON. As a result, the VSS potential (Low) is outputted to the OUT terminal. When the IN terminal shifts to inactive (Low) from the above state, the bootstrap capacitor CV is charged via the resistor Ra from the second power source (This switches OFF the transistor Tr24) and consequently a current flows in the transistor Tr21. This causes a potential of the node NA to be pumped up via the bootstrap capacitor CV, and also causes the VDD potential (High) to be outputted from the OUT terminal, without suffering from a potential drop (threshold drop). Note that in the inverter circuit INV illustrated in FIG. 6, since the OUT terminal is connected to the second power source VDD via the resistor Rw, it is possible to keep outputting the VDD potential (power source potential that has not suffered from a potential drop) even after a bootstrap effect wears off. Further, in the configuration of FIG. 6, the transistor Tr24 is provided and the transistor Tr24 is OFF at the time when the node NA becomes a high potential due to the bootstrap effect. This makes it possible to prevent the transistor Tr23 from deteriorating or being damaged due to the high potential that occurs in the node NA.

Figure 7:
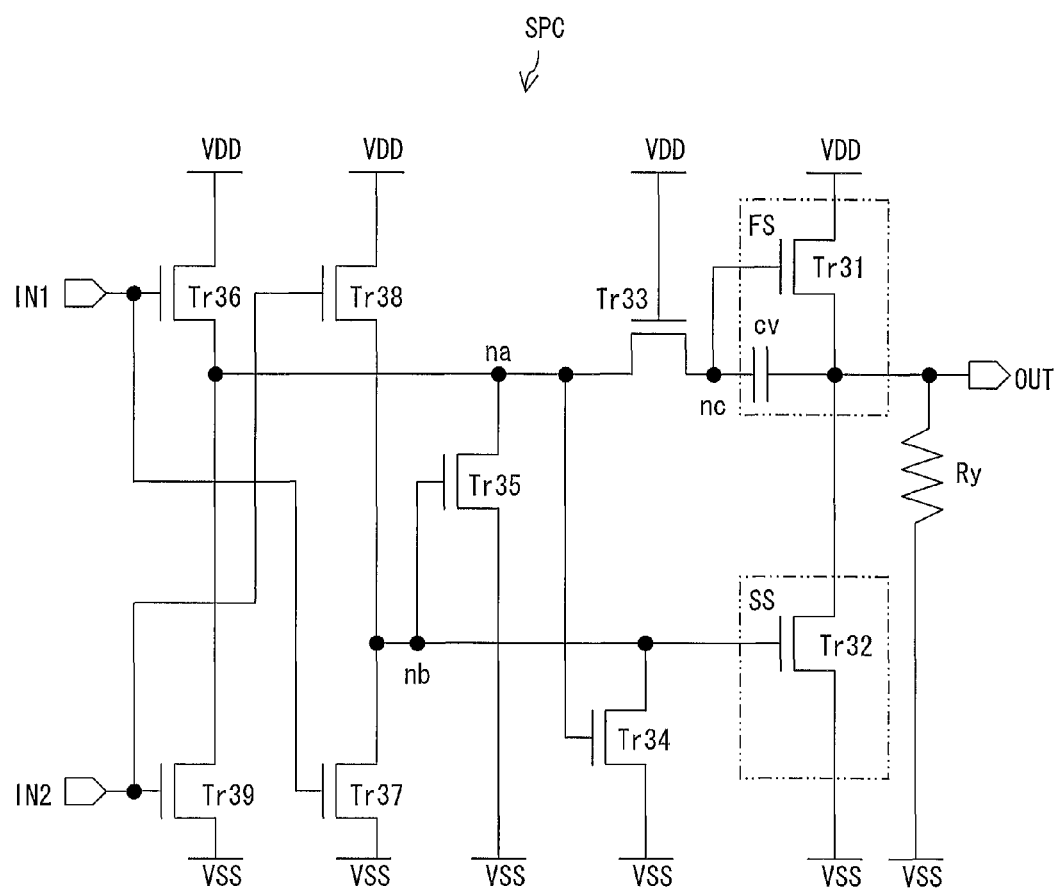
FIG. 7 is a circuit diagram of a signal processing circuit employed in a driver of the liquid crystal display device of the present invention.

FIG. 7 illustrates an example configuration of the signal processing circuit SPC. The signal processing circuit SPC of FIG. 7 includes: an IN1 terminal (first input terminal) and an IN2 terminal (second input terminal); an OUT terminal (output terminal); a node na (first node) and a node nb (second node); a first signal generating section FS that is connected to VDD (first power source) and the OUT terminal and that includes a bootstrap capacitor cv; and a second signal generating section SS that is connected to the node nb, VSS (second power source), and the OUT terminal. When the IN1 terminal becomes active, the node na becomes active (High). When IN2 becomes active, nb becomes active (High). The OUT terminal is connected to the VSS via a resistor Ry.

Specifically, the signal processing circuit SPC includes (i) a transistor Tr31 included in the first signal generating section FS, (ii) a transistor Tr32 included in the second signal generating section SS, and (iii) transistors Tr33 through Tr39. The transistor Tr31 is configured such that: a drain electrode of the transistor Tr31 is connected to VDD; a source electrode and a gate electrode of the transistor Tr31 are connected to each other via the bootstrap capacitor cv; and the source electrode is connected to the OUT terminal, is also connected to VSS via the resistor Ry, and is further connected to VSS via the transistor Tr32. The transistors Tr32 and Tr35 each have a gate electrode connected to the node nb. The transistor Tr34 has a gate electrode connected to the node na. The transistors Tr36 and Tr37 each have a gate electrode connected to the IN1 terminal. The transistors Tr38 and Tr39 each have a gate electrode connected to the IN2 terminal. The gate electrode of the transistor Tr31 is connected to the node nc, which is then connected to the node na via the transistor Tr33. The node na and VSS are connected to each other via the transistor Tr35. The node nb and VSS are connected to each other via the transistor Tr34. The node na and VDD are connected to each other via the transistor Tr36. The node na and VSS are further connected to each other via the transistor Tr39. The node nb and VDD are connected to each other via the transistor Tr38. The node nb and VSS are further connected to each other via the transistor Tr37.

The signal processing circuit SPC of FIG. 7 is arranged such that when the IN1 terminal becomes active (High) while the IN2 terminal is inactive (Low), the node na becomes active (High), and the node nb becomes inactive (Low) (that is, the transistors Tr36 and Tr37 are switched ON). This charges the bootstrap capacitor cv, and causes a current to flow through the transistor Tr31. This in turn pumps up a potential of the node nc through the bootstrap capacitor cv, and causes the OUT terminal to output a VDD potential (High) that is free from a potential drop (threshold drop). Then, when the IN1 terminal becomes inactive (Low) (while the IN2 terminal remains inactive), the nodes nc and nb each start floating. The OUT terminal thus continues to output the VDD potential (High). Next, when the IN2 terminal becomes active (High), the node nb becomes active (High), and the node na becomes inactive (Low) (that is, the transistors Tr38, Tr39, and Tr32 are switched ON). This causes the OUT terminal to output a VSS potential (Low). Therefore, in a configuration illustrated in FIG. 5, input of an INIT signal to the IN1 terminal and a GSP signal to the IN2 terminal allows the OUT terminal to output an INITKEEP signal as illustrated in FIG. 5.

In the case where the resistor Ry is set to have a high resistance value ranging from 0.5 to 5.5 megaohms, the initial value (that is, a source potential of the transistor Tr31 for a period until a transition of the IN 1 terminal to active) of the OUT terminal can be set with use of the resistor Ry. With this configuration, the bootstrap circuit of the first signal generating section FS functions normally when the IN1 terminal becomes active (High).

Figure 8:
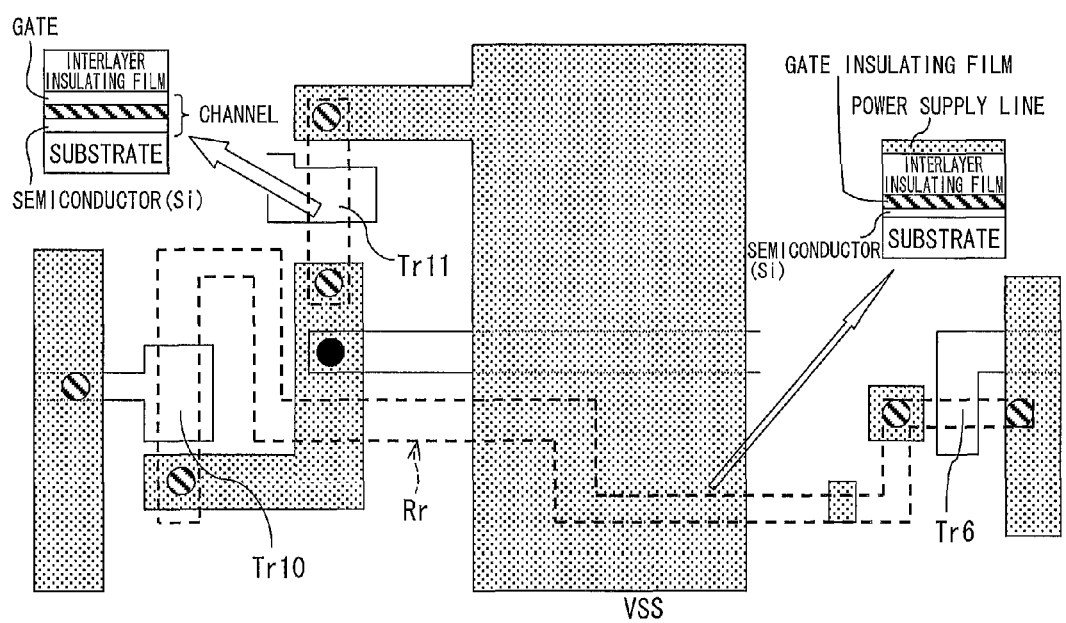
FIG. 8 is an example layout of the flip-flop illustrated in FIG. 1.
Figure 9:
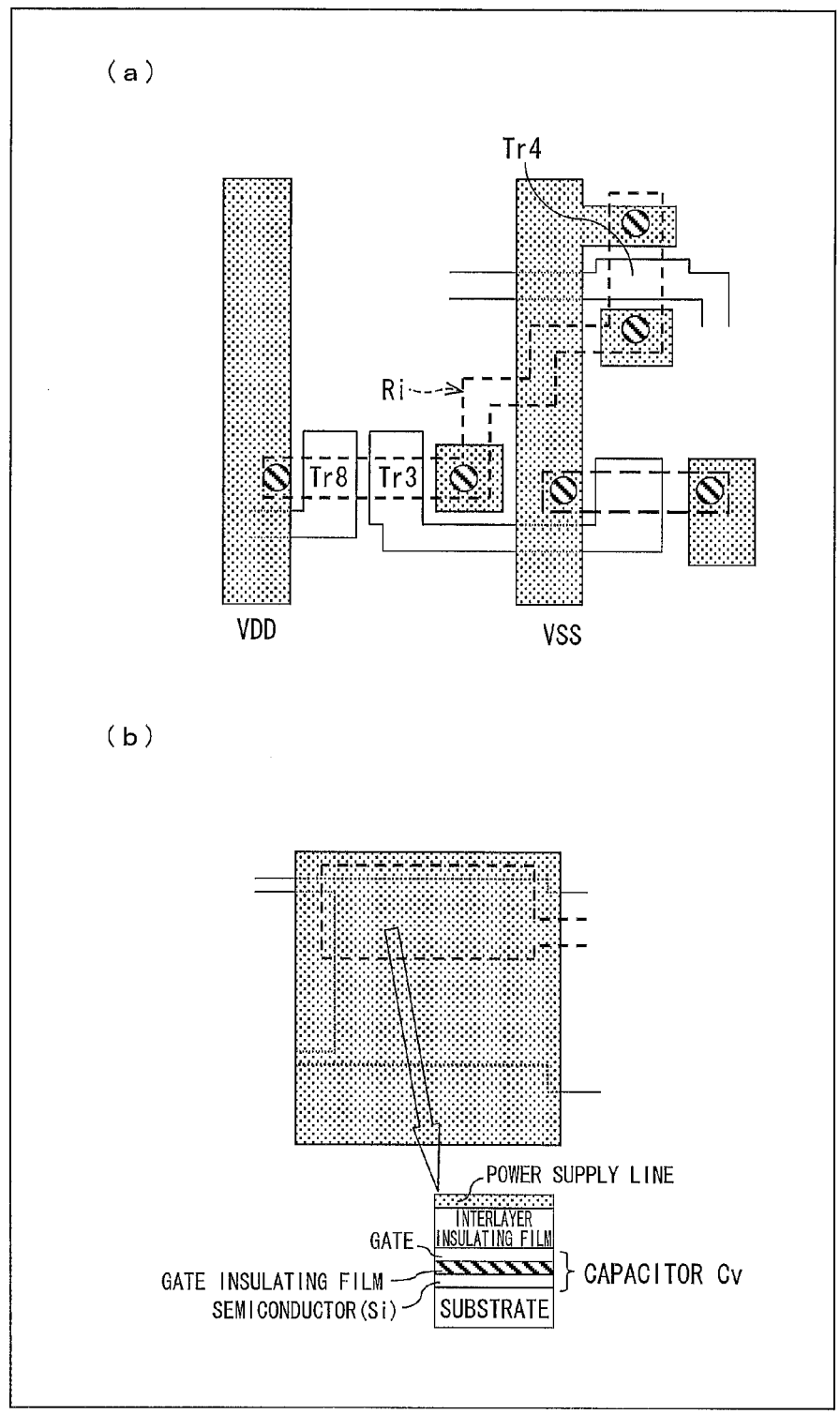
FIG. 9 is another example layout of the flip-flop illustrated in FIG. 1.

FIGS. 8 and 9 each illustrate an example layout of the flip-flop of FIG. 1. This flip-flop includes, sequentially from a substrate side, (i) a layer for forming channels of the respective transistors, (ii) a gate insulating layer, (iii) a layer for forming gate electrodes of the respective transistors, (iv) an interlayer insulating layer, and (v) a signal wiring (including a power supply line). The resistor Rr of the reset section RS may be made of a material for forming the channels of the respective transistors (see FIG. 8), or the resistor Ri of the first input section FI may be made of a material for forming channels of the respective transistors (see (a) of FIG. 9). Such a configuration can reduce the number of contact holes and a layout area. Further, the bootstrap capacitor Cv of the first output section FO may be formed by an overlapping portion at which (i) an electrode made of the material for forming the channels of the respective transistors (the electrode being connected to the source electrode of the transistor Tr1 through a contact hole), (ii) the gate electrode of the transistor Tr1, and (iii) a gate insulating film overlap one another. This overlapping portion may further be overlapped with a VH (VDD) line (see (b) of FIG. 9). This configuration also can reduce layout area.

Figure 10:
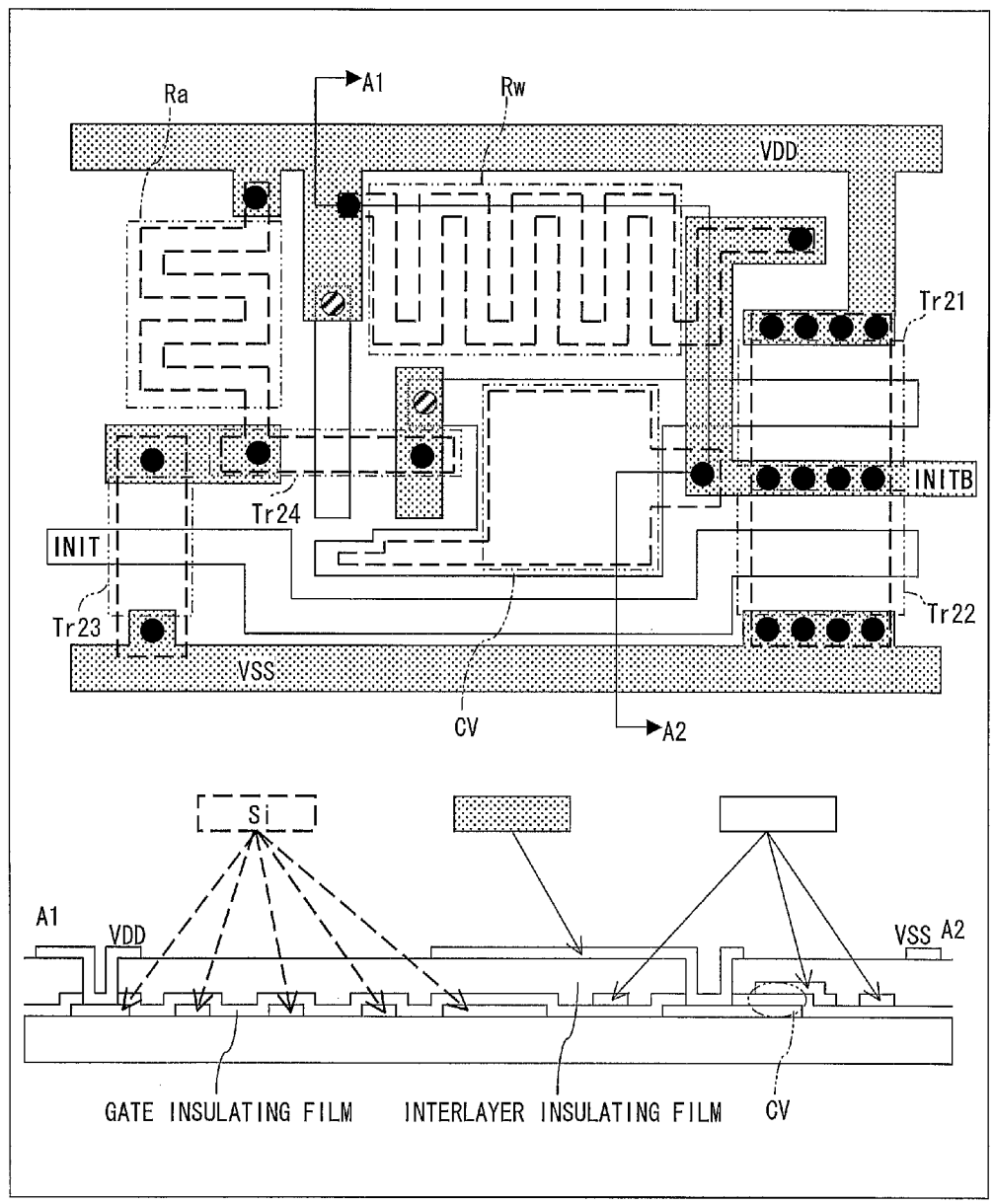
FIG. 10 is an example layout of the inverter circuit illustrated in FIG. 6.

FIG. 10 is an example layout of FIG. 6. The inverter INV includes, sequentially from the substrate side, (i) a layer for forming channels of the respective transistors, (ii) a gate insulating layer, (iii) a layer for forming gate electrodes of the respective transistors, (iv) an interlayer insulating layer, and (v) a signal wiring (including a power supply line). As illustrated in FIG. 10, the resistor Ra and the resistor Rw may be made of a material for forming the channels of the respective transistors. Such a configuration can reduce the number of contact holes and a layout area. Further, the bootstrap capacitor CV may be formed by an overlapping portion at which (i) an electrode made of the material for forming the channels of the respective transistors (the electrode being connected to the source electrode of the transistor Tr21 through a contact hole), (ii) the gate electrode of the transistor Tr21, and (iii) a gate insulating film overlap one another. This configuration also can reduce the number of contact holes and the layout area.

Figure 11:
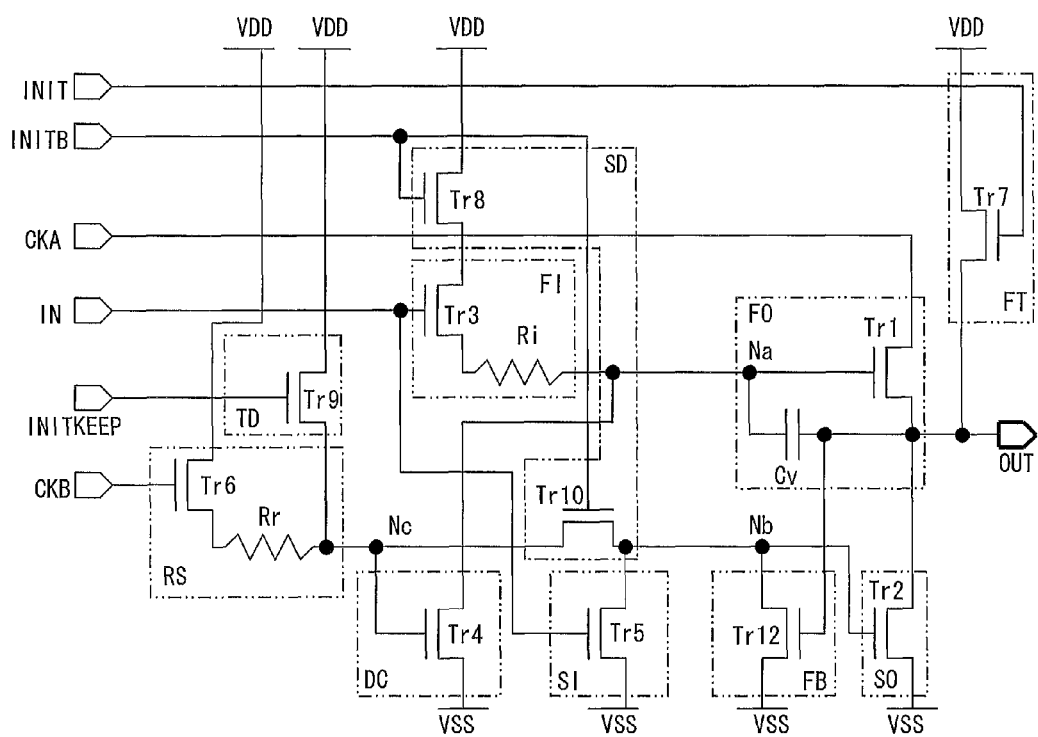
FIG. 11 is a modified example layout of the flip-flop illustrated in FIG. 1.

The above flip-flop may alternatively be configured as illustrated in FIG. 11, specifically by removing, from the configuration of FIG. 1, (i) the relay circuit RC and the malfunction preventing section SC (that is, the transistors Tr13 through Tr15) and also (ii) the transistor Tr11 of the first initialization circuit FT. The description below deals with an all-ON operation of the flip-flop of FIG. 11.

During an all-ON period, the INIT signal is active (High), the INITB signal is active (Low), and the INITKEEP signal is active (High). This causes the bootstrap capacitor Cv to be discharged by the discharge section DC (because the transistors Tr9 and Tr4 are switched ON, and the transistor Tr1 is switched OFF), which in turn causes the first output section FO to be inactive and the second output section SO to be floating (because the transistor Tr10 is switched OFF). However, the first initialization section FT causes the source electrode (OUT terminal) of the transistor Tr1 of the first output section FO to be connected to VDD. This allows a VDD potential (High) to be reliably outputted to the OUT terminal regardless of the CK1 and CK2 signals and causes the node Nb to be inactive (Low) due to the transistor Tr12, thus switching the second output section SO OFF. Until the GSP signal becomes active after the completion of the all-ON period, the INIT signal is inactive (Low), the INITB signal is inactive (High), and the INITKEEP signal is active (High). This switches the transistors Tr8 and Tr10 ON, and thus causes the second output section SO to be active (that is, switches the transistor Tr2 ON), which in turn allows a VSS potential (Low) to be reliably outputted to the OUT terminal regardless of the CK1 and CK2 signals.

Figure 12:
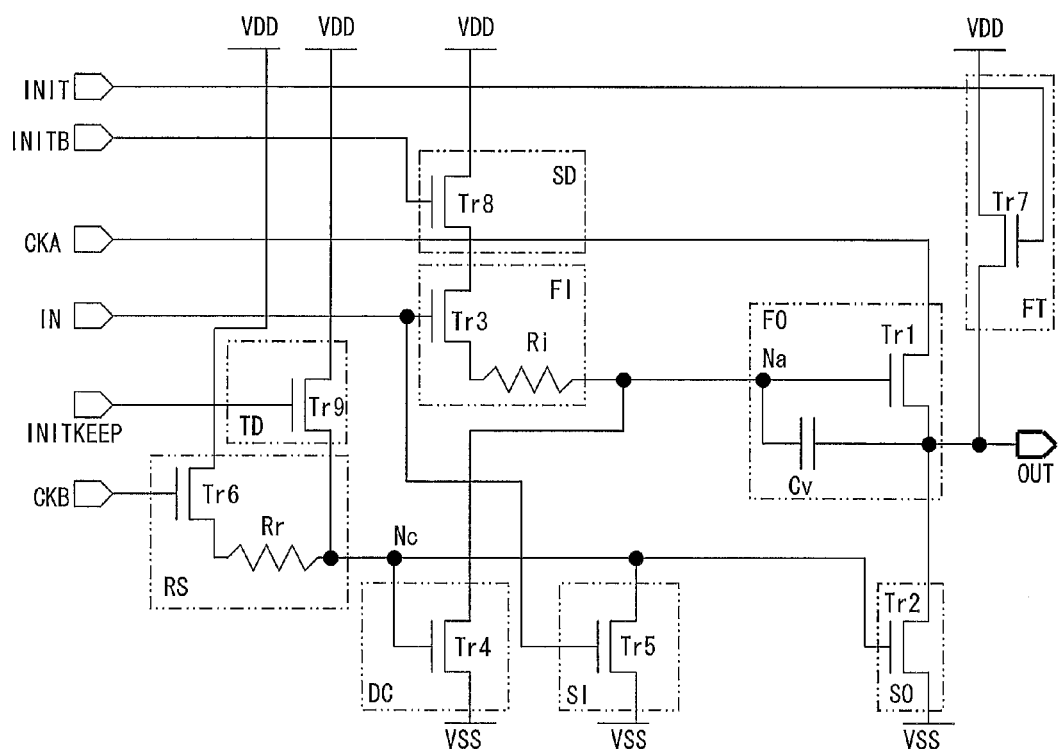
FIG. 12 is another modified example layout of the flip-flop illustrated in FIG. 1.
Figure 13:
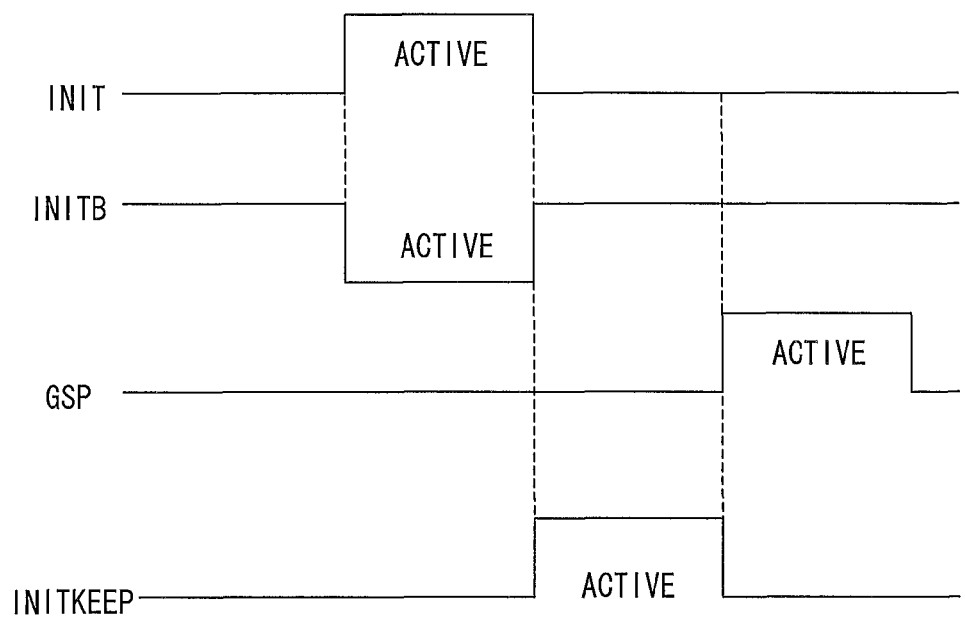
FIG. 13 is a timing chart of first to third initialization signals that are inputted into the flip-flop illustrated in FIG. 12.

The above flip-flop may alternatively be (a) configured as illustrated in FIG. 12, specifically by removing, from the configuration of FIG. 1, (i) the relay circuit RC, the feedback section FB, and the malfunction preventing section SC (that is, the transistors Tr12 through Tr15) and also (ii) the transistor Tr11 of the first initialization circuit FT and the transistor Tr10 of the second initialization circuit FT, and (b) arranged such that the flip-flop receives an INIT signal, an INITB signal, and an INITKEEP signal all illustrated in FIG. 13. The description below deals with an all-ON operation for the case illustrated in FIGS. 12 and 13.

During an all-ON period, the INIT signal is active (High), the INITB signal is active (Low), and the INITKEEP signal is inactive (Low). This causes the bootstrap capacitor Cv to be discharged by the discharge section DC (because the transistor Tr4 is switched ON, and the transistors Tr1 and Tr8 are switched OFF), which in turn causes the first output section FO to be inactive and the second output section SO to be floating (because the transistors Tr5 and Tr9 are switched OFF). Thus, the first initialization section FT causes the source electrode (OUT terminal) of the transistor Tr1 of the first output section FO to be connected to VDD. This allows a VDD potential (High) to be reliably outputted to the OUT terminal regardless of the CK1 and CK2 signals, and causes an OUT terminal of another stage to be connected to the IN terminal. This causes the IN terminal to be active (High), which in turn switches the transistor Tr5 ON. This switches the second output section SO OFF. During a period from the completion of the all-ON period until activation of the GSP signal, the INIT signal is inactive (Low), the INITB signal is inactive (High), and the INITKEEP signal is active (High). This switches the transistor Tr9 ON, and thus causes the second output section SO to be active (that is, switches the transistor Tr2 ON). This in turn allows a VSS potential (Low) to be reliably outputted to the OUT terminal regardless of the CK1 and CK2 signals.

Figure 14:
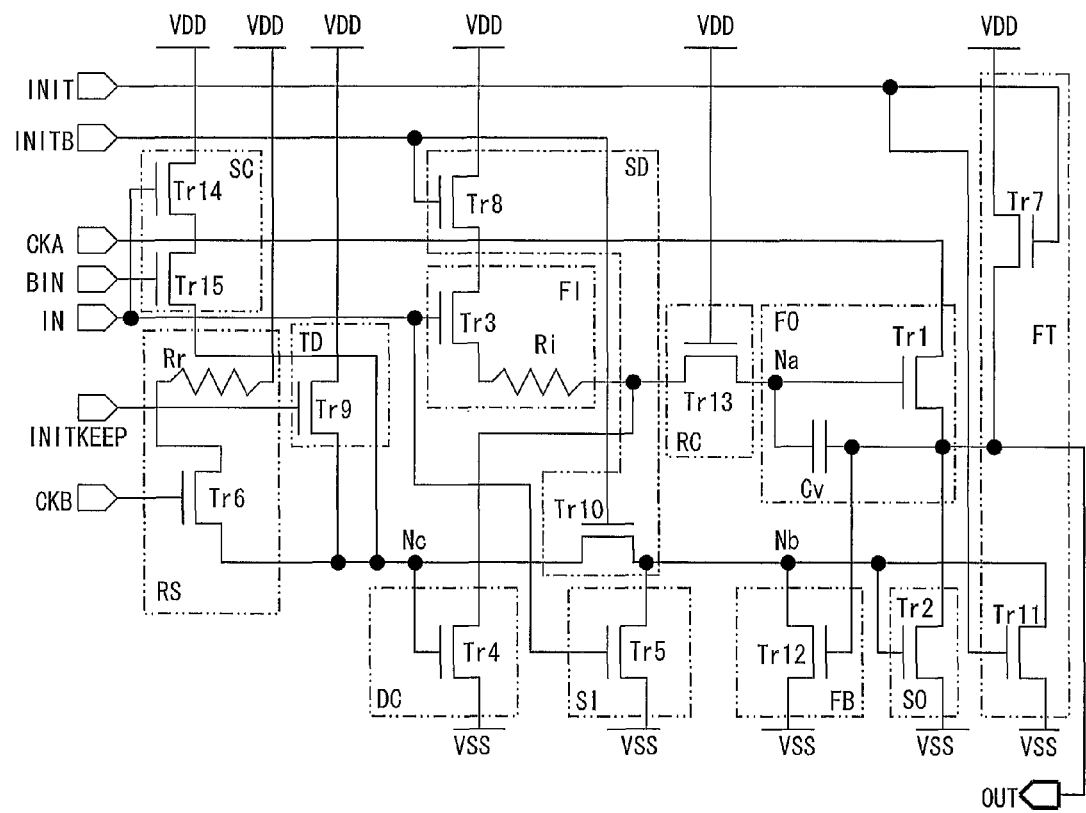
FIG. 14 is still another modified example layout of the flip-flop illustrated in FIG. 1.

The flip-flop of FIG. 1 is configured such that the third node Nc is connected to VDD via the resistor Rr and the transistor Tr6 in the reset circuit RS (Note that the transistor Tr6 is located on the side of the resistor Rr, while the transistor Tr6 is located on the side of VDD). The flip-flop of FIG. 1 is, however, not limited to such a configuration, and may alternatively be configured as illustrated in FIG. 14 such that the third node Nc is connected to VDD via the transistor Tr6 and the resistor Rr (Note that the transistor Tr6 is located on the side of the third node, while the resistor Rr is located on the side of VDD).

Figure 15:
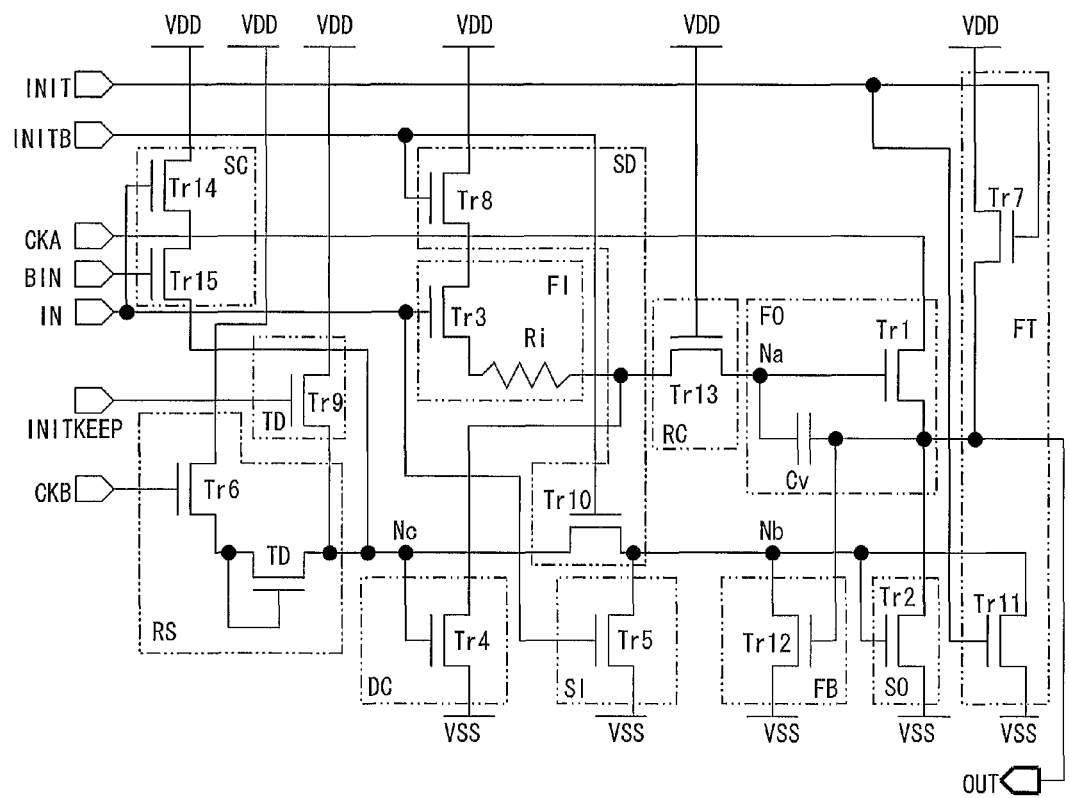
FIG. 15 is yet another modified example layout of the flip-flop illustrated in FIG. 1.

The flip-flop of FIG. 1 is configured such that the reset circuit RS is provided with a resistor Rr. The flip-flop of the present invention is, however, not limited to such a configuration, and may alternatively be configured as illustrated in FIG. 15 by replacing the resistor Rr by a diode-connected transistor TD.

Figure 16:
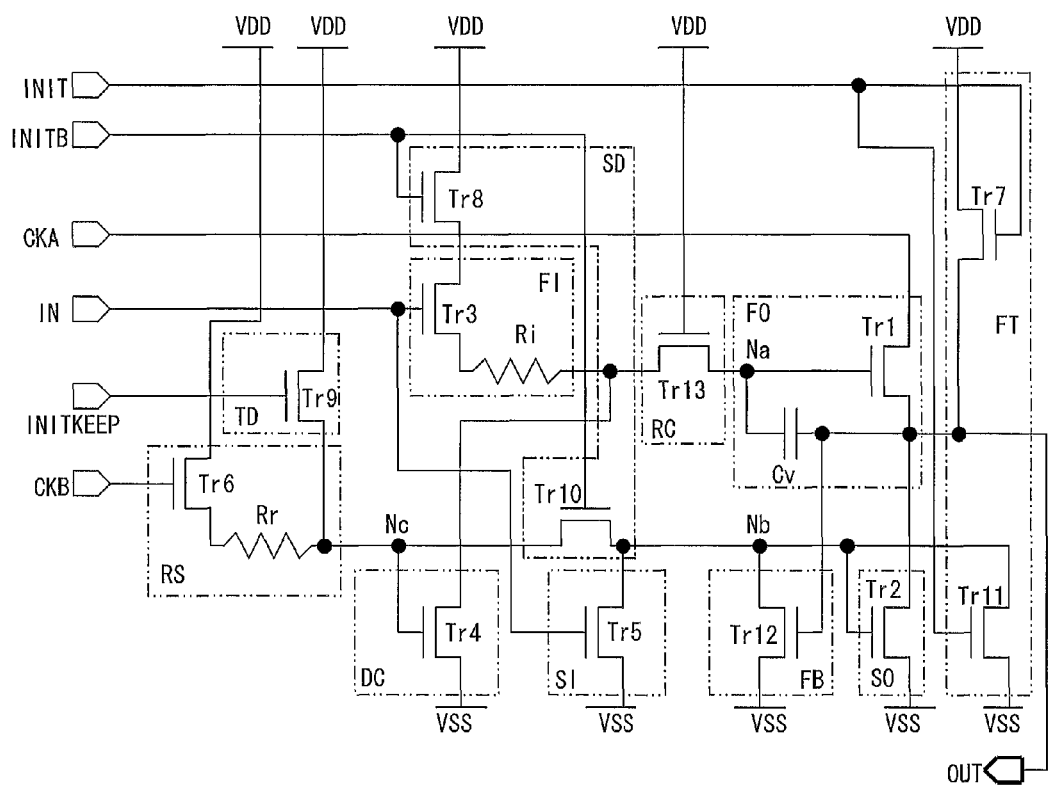
FIG. 16 is a still further modified example layout of the flip-flop illustrated in FIG. 1.
Figure 17:
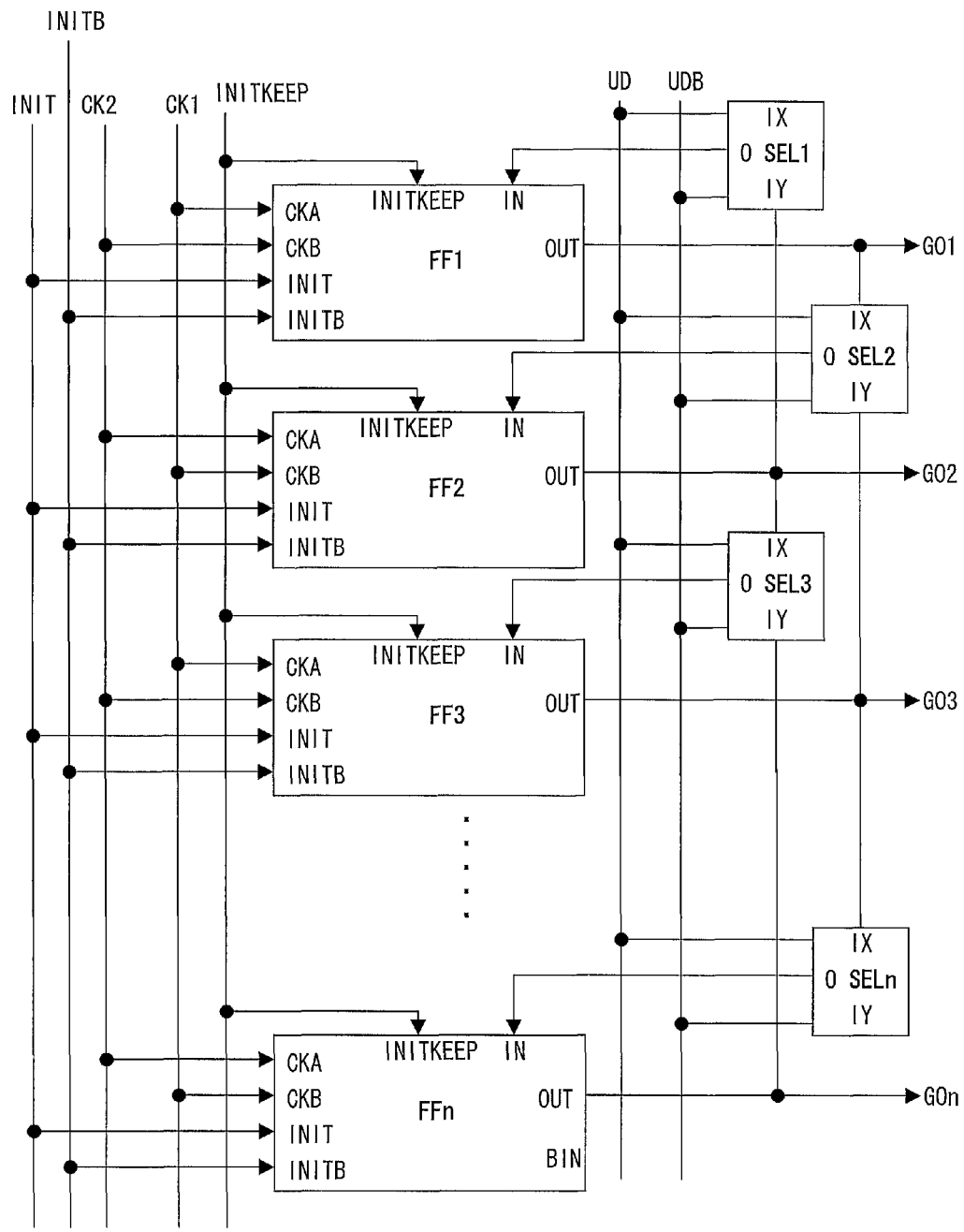
FIG. 17 is a circuit diagram illustrating an example configuration of a shift register (bi-directional shift) including the flip-flop illustrated in FIG. 15.
Figure 18:
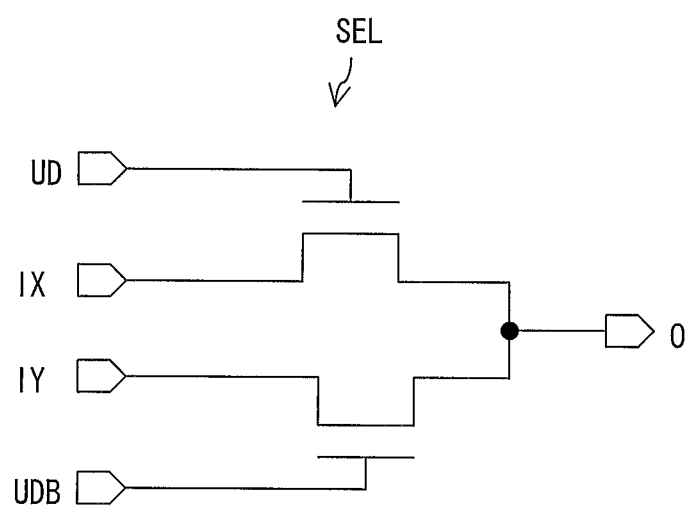
FIG. 18 is an example of a shift direction determining circuit employed in the shift register illustrated in FIG. 16.
Figure 19:
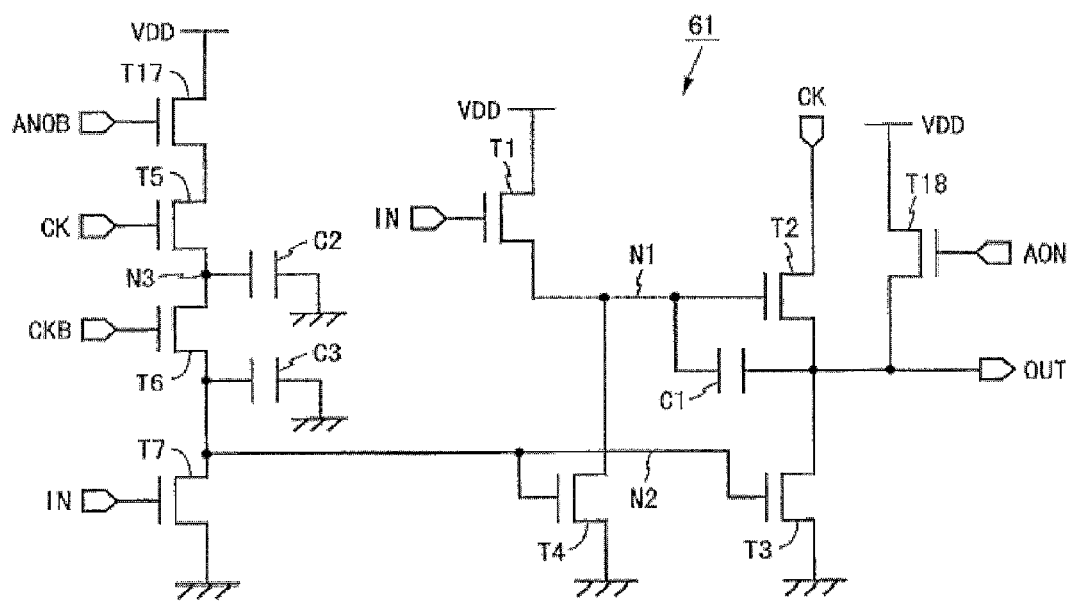
FIG. 19 is a configuration of a conventional flip-flop.
Figure 20:
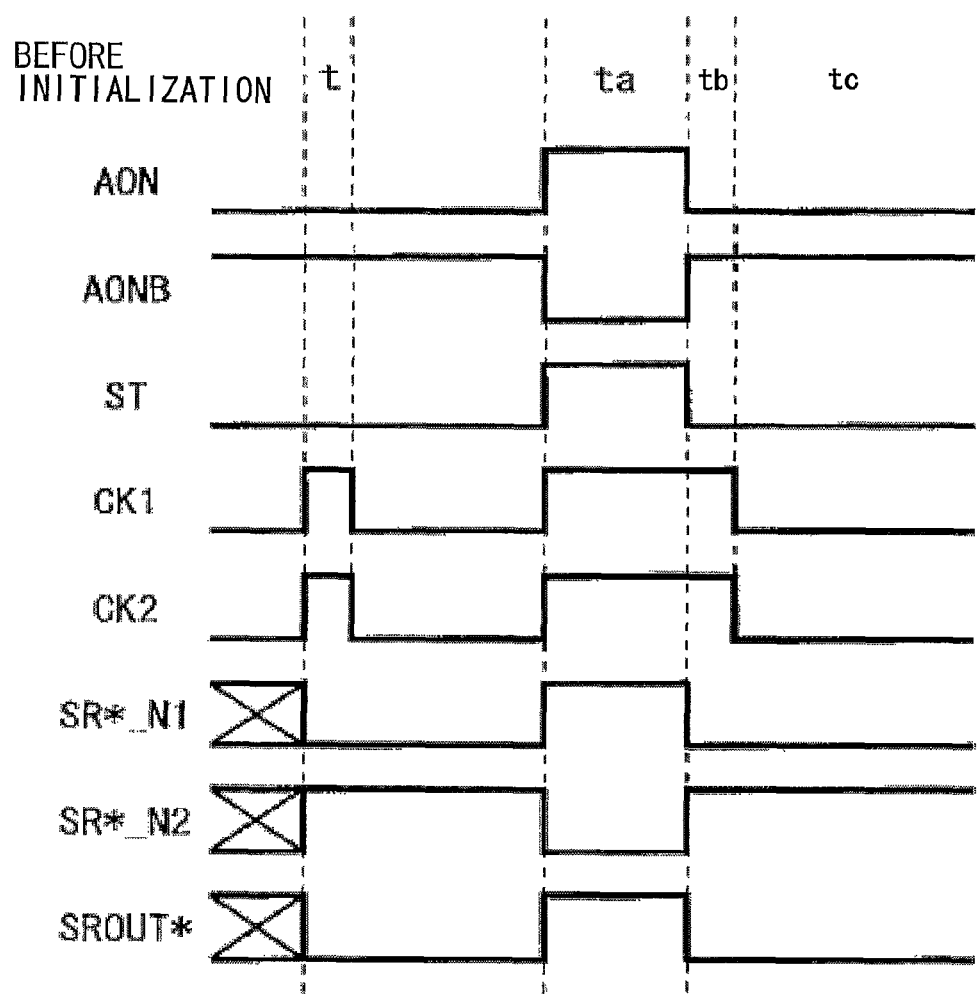
FIG. 20 is a timing chart illustrating an operation of the conventional shift register illustrated in FIG. 19.

The flip-flop of FIG. 1 may alternatively be configured as illustrated in FIG. 16 by removing only the malfunction preventing section from the configuration of FIG. 1. Further, the above flip-flop (for example, the flip-flop illustrated in FIG. 16) may be used to provide a bi-directionally shiftable shift register as illustrated in FIG. 17. The flip-flop, in this case, is provided with shift direction determining circuits SEL each between adjacent stages, and involves a UD signal and a UDB signal to be inputted into each of the shift direction determining circuits SEL. In the case of a forward direction (downward direction) shift, a shift direction determining circuit SEL2, for example, connects an OUT terminal of a flip-flop FF1 to an IN terminal of a flip-flop FF2. In the case of a reverse direction (upward direction) shift, a shift direction determining circuit SEL1, for example, connects an OUT terminal of the flip-flop FF2 to an IN terminal of the flip-flop FF1. The shift direction determining circuits SEL each include, as illustrated in FIG. 18, two N channel transistors. One of the two N channel transistors has (i) a gate terminal connected to a UD terminal, (ii) a source electrode connected to an IX terminal, and (iii) a drain electrode connected to an O terminal. Meanwhile, the other one of the two N channel transistors has (i) a gate terminal connected to a UDB terminal, (ii) a source electrode connected to an IY terminal, and (iii) a drain electrode connected to the O terminal.

The present invention is not limited to the above embodiment, but further encompasses (i) embodiments achieved by appropriately modifying the above embodiment on the basis of known techniques and common general technical knowledge and (ii) embodiments achieved by combining such embodiments. Further, the operational advantages and the like described in the above embodiment are merely examples.

INDUSTRIAL APPLICABILITY

The flip-flop of the present invention is suitably used particularly in a driver circuit for a liquid crystal display device.

REFERENCE SIGNS LIST

INIT first initialization signal
INITB second initialization signal
INITKEEP third initialization signal
Na to Nc first to third nodes
VDD high-potential power source
VSS low-potential power source
Tr1 to Tr13 first to thirteenth transistors

The invention claimed is:

1. A flip-flop comprising:
an input terminal;
an output terminal;
a first control signal terminal and a second control signal terminal;
a first output section including a bootstrap capacitor, the first output section being connected to the first control signal terminal and the output terminal;
a second output section connected to a first power source and the output terminal;
a first input section connected to the input terminal and a second power source, the first input section charging the bootstrap capacitor;
a discharge section discharging the bootstrap capacitor;
a second input section connected to the input terminal and the first power source, the second input section being also connected to the second output section;
a reset section controlling the discharge section and the second output section, the reset section being connected to the second control signal terminal;
a first initialization section controlling the first output section;

a second initialization section controlling the first input section; and a third initialization section controlling the discharge section and the second output section.

2. The flip-flop as set forth in claim 1, wherein:
the first initialization section electrically connects or disconnects the first output section and the second power source;
the second initialization section electrically connects or disconnects the first input section and the second power source; and
the third initialization section electrically connects or disconnects the discharge section and the second power source and also electrically connects or disconnects the second output section and the second power source.

3. The flip-flop as set forth in claim 1, wherein:
the second initialization section further connects or disconnects the second output section and each of the third initialization section, the reset section and the discharge section.

4. The flip-flop as set forth in claim 1, wherein:
the first initialization section further controls the second output section.

5. The flip-flop as set forth in claim 1, further comprising:
a feedback section controlling the second output section, the feedback section being connected to the output terminal.

6. The flip-flop as set forth in claim 1, wherein:
the first input section and the first output section are connected via a relay section.

7. The flip-flop as set forth in claim 1, wherein:
the first output section is provided with a first transistor;
the second output section is provided with a second transistor;
the first input section is provided with a third transistor;
the discharge section is provided with a fourth transistor;
the second input section is provided with a fifth transistor;
the reset section is provided with a sixth transistor;
the first initialization section is provided with a seventh transistor;
the second initialization section is provide with a eighth transistor; and
the third initialization section is provided with a ninth transistor,
the first to ninth transistors all being of an identical conductivity-type.

8. The flip-flop as set forth in claim 7, further comprising:
first to third initialization terminals; and
first to third nodes, wherein:
the first transistor has conductive electrodes one of which is connected to the first control signal terminal and the other one of which is connected to a control terminal of the first transistor via the bootstrap capacitor, which other conductive electrode is connected to the output terminal and also connected to the first power source via the second transistor;
respective control terminals of the third and fifth transistors are connected to the input terminal;
a control terminal of the sixth transistor is connected to the second control signal terminal;
a control terminal of the seventh transistor is connected to the first initialization terminal;
a control terminal of the eighth transistor is connected to the second initialization terminal;
a control terminal of the ninth transistor is connected to the third initialization terminal;

the first node is connected to one of conductive electrodes of the third transistor directly or via a resistor, and also connected to the first power source via the fourth transistor;
the other one of the conductive electrodes of the third transistor is connected to the second power source via the eighth transistor;
the second node is connected to a control terminal of the second transistor and also connected to the first power source via the fifth transistor; and
the third node is connected to a control terminal of the fourth transistor, also connected to the second power source via the ninth transistor, and further connected to the second power source via the sixth transistor and another resistor that is different from the resistor.

9. The flip-flop as set forth in claim 8 further comprising:
a tenth transistor in the second initialization section, the tenth transistor having a control terminal connected to the second initialization terminal, wherein:
the second node is connected to the third node via the tenth transistor.

10. The flip-flop as set forth in claim 8, wherein:
the first initialization section is further provided with an eleventh transistor whose control terminal is connected to the first initialization terminal; and
the second node is connected to the first power source via the eleventh transistor.

11. The flip-flop as set forth in claim 8 further comprising:
a twelfth transistor whose control terminal is connected to the output terminal, wherein:
the second node is connected to the first power source via the twelfth transistor.

12. The flip-flop as set forth in claim 8, further comprising:
a thirteenth transistor whose control terminal is connected to the second power source, wherein:
the first node is connected to the control terminal of the first transistor via the thirteenth transistor.

13. The flip-flop as set forth in claim 8, wherein:
respective constituent materials of the resistor and the another resistor are identical to a constituent material of a channel of each of the first to ninth transistors.

14. The flip-flop as set forth in claim 1, further comprising:
the first output section is provided with a first transistor; and
the bootstrap capacitor is a parasitic capacitor of the first transistor.

15. A shift register comprising a flip-flop as set forth in claim 1, in each stage.

16. The shift register as set forth in claim 15, wherein:
a second control signal terminal of a flip-flop in one stage is connected to an output terminal of a flip-flop in a subsequent stage.

17. A driver circuit comprising:
a shift register including a flip-flop as set forth in claim 1 in each stage, wherein:
the first and second control signal terminals of the flip-flop in each stage of the shift register are supplied with respective clock signals whose active periods do not overlap.

18. driver circuit comprising:
a shift register including a flip-flop of claim 8 in each stage, wherein:
in the flip-flop in each stage of the shift register, (i) the first initialization terminal is supplied with a first initialization signal, (ii) the second initialization terminal is supplied with a second initialization signal, and (iii) the third initialization terminal is supplied with a third initialization signal.

19. The driver circuit as set forth in claim 18, wherein:
the second initialization signal is an inversion signal of the first initialization signal; and
the third initialization signal becomes active at a timing when the first initialization signal shifts from active to inactive, and then the third initialization signal becomes inactive after the timing.

20. The driver circuit as set forth in claim 19, wherein the third initialization signal becomes inactive in synchronization with a timing when a start pulse becomes active which start pulse regulates a shift start timing.

* * * * *